(12) United States Patent
Du et al.

(10) Patent No.: US 10,783,345 B2
(45) Date of Patent: Sep. 22, 2020

(54) DISPLAY UNIT, DISPLAY PANEL, DISPLAY DEVICE AND OPTICAL INFORMATION STORAGE DEVICE

(71) Applicant: BOE TECHNOLOGY GROUP CO., LTD., Beijing (CN)

(72) Inventors: Shuang Du, Beijing (CN); Pao Ming Tsai, Beijing (CN); Dejun Bu, Beijing (CN); Lu Liu, Beijing (CN); Liqiang Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 277 days.

(21) Appl. No.: 15/980,605

(22) Filed: May 15, 2018

(65) Prior Publication Data

US 2019/0156094 A1    May 23, 2019

(30) Foreign Application Priority Data

Nov. 21, 2017 (CN) .......................... 2017 1 1164783

(51) Int. Cl.
| | | |
|---|---|---|
| *G06K 9/00* | (2006.01) | |
| *G02B 5/23* | (2006.01) | |
| *H01L 27/32* | (2006.01) | |
| *H01L 27/146* | (2006.01) | |

(52) U.S. Cl.
CPC ............ *G06K 9/0004* (2013.01); *G02B 5/23* (2013.01); *H01L 27/3232* (2013.01); *H01L 27/14678* (2013.01); *H01L 27/3234* (2013.01)

(58) Field of Classification Search
CPC .. G02B 5/23; G06K 9/0004; H01L 27/14678; H01L 27/3232; H01L 27/3234
See application file for complete search history.

(56) References Cited

U.S. PATENT DOCUMENTS 9,739,657 B2 * 8/2017 Cho ...................... G01J 1/0425

FOREIGN PATENT DOCUMENTS

| CN | 101311244 A | 11/2008 |
|---|---|---|
| CN | 103376952 A | 10/2013 |
| CN | 104063094 A | 9/2014 |
| CN | 104776913 A | 7/2015 |
| CN | 107179871 A | 9/2017 |
| CN | 107305411 A | 10/2017 |

OTHER PUBLICATIONS

First Chinese Office Action dated May 7, 2019, received for corresponding Chinese Application No. 201711164783.7.

* cited by examiner

*Primary Examiner* — Bobbak Safaipour
(74) *Attorney, Agent, or Firm* — Kinney & Lange, P.A.

(57) ABSTRACT

Disclosed are a display unit, a display panel, a display device and an optical information storage device. The display unit comprises a photochromic thin film and an optical filter thin film on a side of the photochromic thin film. The photochromic thin film presents a colored state under an irradiation of a first preset light, and presents a transparent state under an irradiation of a second preset light. A wavelength range of the first preset light is different from that of the second preset light. The optical filter thin film is a one-way optical filter thin film that is substantially transparent to lights coming from a photochromic thin film side, and functions as an optical filter to lights coming from a side opposite the photochromic side to allow the first preset light to pass through and to reflect lights of other wavelengths.

20 Claims, 4 Drawing Sheets

DISPLAY UNIT, DISPLAY PANEL, DISPLAY DEVICE AND OPTICAL INFORMATION STORAGE DEVICE

CROSS REFERENCE TO RELATED APPLICATION

The present application claims a priority benefit of Chinese Patent Application No. 201711164783.7, filed on Nov. 21, 2017, the entire contents thereof being incorporated herein by reference.

TECHNICAL FIELD

The present disclosure relates to the display-related technical field, and particularly to a display unit, a display panel, a display device and an optical information storage device.

BACKGROUND

With developments of display technologies, terminal devices such as smartphones, tablet computers and the like have become ubiquitous. As large amounts of important data, such as personal information, are often stored in these terminal devices, the safety thereof becomes especially important. At present, security forms such as passwords, graphs, fingerprints and the like are often used to achieve the cipher protection of the terminal devices. Fingerprints, composed of rugged lines on the finger surface skin, represent a unique feature of the human body, and the complexity thereof can provide sufficient features for identification. Thus, fingerprint identification is a technique which utilizes the uniqueness and stability characteristics of the human fingerprint to achieve personal identification without requiring use of the user's memory. Accordingly, the use of fingerprints offer safer and more reliable cipher protection than other manners.

SUMMARY

A first aspect of the present disclosure provides a display unit, comprising:
a photochromic thin film; and
an optical filter thin film on a side of the photochromic thin film, wherein
the photochromic thin film presents a colored state under an irradiation of a first preset light, and presents a transparent state under an irradiation of a second preset light, a wavelength range of the first preset light being different from that of the second preset light; and
the optical filter thin film is an one-way optical filter thin film, which is substantially transparent to lights coming from a photochromic thin film side, but functions as an optical filter to lights coming from the other side, only allowing the first preset light to be transmitted through and reflecting lights of other wavelengths.

Optionally, the photochromic thin film comprises a reversible photochromic material.

Optionally, the reversible photochromic material at least includes one of spirooxazines and spiropyrans or a mixture thereof; the first preset light is a ultraviolet light, and the second preset light is a visible light.

Optionally, the reversible photochromic material further has a photoacid polymer material mixed therein.

Optionally, the photoacid polymer is polyvinylidene chloride-methyl acrylate.

Optionally, the reversible photochromic material further has a photoinitiator and/or a photocatalyst mixed therein.

Optionally, the optical filter thin film has a laminated structure of multiple film layers with different refractive indexes.

Optionally, the optical filter thin film comprises at least one material selected from the group consisting of $Ti_2O_5$, $TiO_2$, $SiO_2$ and $MgF_2$.

A second aspect of the present disclosure provides a display panel, comprising:
a transparent cover plate,
the display unit according to any one of the above items, and
a light emitting unit for emitting the second preset light, on the photochromic thin film side of the display unit.

Optionally, the display unit is positioned in a display area of the display panel.

Optionally, the display panel is a flexible display panel, and the cover plate is a flexible cover plate.

Optionally, the display panel is full screen without borders.

Optionally, the transparent cover plate is disposed on a side of the display unit close to the light emitting unit and the photochromic thin film of the display unit is close to the transparent cover plate, such that the second preset light emitted by the light emitting unit is allowed to enter into the photochromic thin film via the transparent cover plate, and the first preset light is allowed to enter into the photochromic thin film via the optical filter thin film.

Optionally, the display panel further comprises a fingerprint identification sensor, a semiconductor thin film and a protective layer;
when the transparent cover plate is disposed on a side of the display unit close to the light emitting unit, the semiconductor thin film and the protective layer are sequentially disposed on a side of the display unit away from the light emitting unit, and the fingerprint identification sensor is disposed between the transparent cover plate and the light emitting unit;
wherein, the display unit coincides with a corresponding fingerprint identification area of the fingerprint identification sensor, so as to display the fingerprint identification area under the irradiation of the first preset light and to become a transparent state under the irradiation of the second preset light; and the semiconductor thin film is configured to have a structure of stripes separated with each other, so as to cooperate with the fingerprint identification sensor to achieve a fingerprint identification.

Optionally, the transparent cover plate is disposed on a side of the display unit away from the light emitting unit and the optical filter thin film of the display unit is close to the transparent cover plate, such that the second preset light emitted by the light emitting unit is allowed to enter into the photochromic thin film, and the first preset light is allowed to pass through the transparent cover plate and the optical filter thin film sequentially and enter into the photochromic thin film.

Optionally, when the transparent cover plate is disposed on a side of the display unit away from the light emitting unit, a semiconductor thin film and a protective layer are sequentially disposed on a side of the transparent cover plate away from the light emitting unit, and a fingerprint identification sensor is disposed between the display unit and the light emitting unit;
wherein, the display unit coincides with a corresponding fingerprint identification area of the fingerprint identification sensor, so as to display the fingerprint identification area under the irradiation of the first preset light and to become a transparent state under the irradiation of the second preset light; and the semiconductor thin film is configured to have a structure of stripes separated with each other, so as to cooperate with the fingerprint identification sensor to achieve a fingerprint identification.

Optionally, the display unit is configured to be present in a plurality of groups, so as to cooperate with a preset control unit to achieve a corresponding control function.

A third aspect of the present disclosure provides a display device comprising the display panel according to any one of the above items.

A fourth aspect of the present disclosure provides an optical information storage device comprising a reversible photochromic thin film as a storage medium for storing an optical information, wherein the reversible photochromic thin film presents a colored state under an irradiation of a first preset light, and presents a transparent state under an irradiation of a second preset light, a wavelength range of the first preset light being different from that of the second preset light.

Optionally, the reversible photochromic thin film in the optical information storage device is patterned.

DETAILED DESCRIPTION

Figure 1:
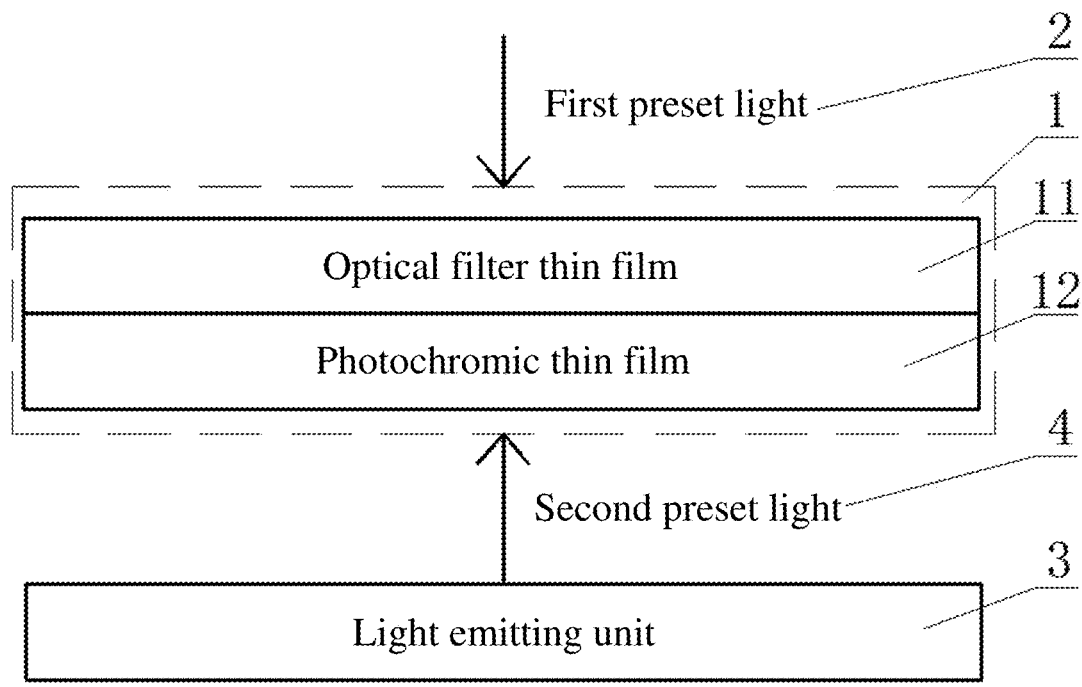
FIG. 1 is a structure schematic diagram of one embodiment of a display unit provided in the present disclosure.

In order to make the objects, technical solutions and advantages of the present disclosure more clear and apparent, the present disclosure will be further described in detail below in combination with particular embodiments and with reference to the drawings.

It should be noted that expressions using "first" and "second" in the embodiments of the present disclosure are intended to distinguish two different entities or parameters with the same name. Thus, the use of the words "first" or "second" are for the convenience of expression, and should not be understood as limiting the embodiments of the present disclosure, and this will not be reiterated in subsequent embodiments.

In relevant technologies, by forming a conducting circuit on a base substrate, a capacitive fingerprint identification sensor detects a fingerprint pattern through different capacitances generated by the convexes of fingerprint ridges and the concaves of fingerprint valleys when a finger is contacted with the sensor. Further, to achieve fingerprint identification in a flexible display screen, a specific fingerprint identification area is disposed, that is, to make a certain concave area on the front or back surface as a fingerprint identification area. In this manner, not only the overall appearance of the product will be influenced, but also the non-display area will be increased, thereby preventing the use in a full screen flexible display product without borders. With the consumer demand for continuously increasing screen occupation ratio, the area of the display area is continuously increased, resulting in reduced borders, and it has become a trend to integrate the fingerprint identification technique into the display area. However, there is no corresponding solution currently.

During the achievement of the present application, the inventors have found that the relevant technologies at least have the following problems: it is difficult for the relevant technologies to integrate corresponding identification or control techniques into the display area to achieve a narrow border or full screen design, and especially for fingerprint identification, a non-display area for identifying the fingerprint cannot be avoided.

In view of this, the present disclosure provides a display unit, a display panel and a display device, in which an identification or control area can be integrated into a display area, so that it does not influence the normal display of the display area, and if needed, it can also display a certain area to achieve corresponding identification or control function, thereby improving the user's experience.

Particularly, with respect to the current aspiration toward full screen or high screen occupation ratio, users increasingly desire to integrate the fingerprint identification into the display area of a display screen, or achieve more control functions for subsequent display area with a higher screen occupation ratio. For example, fingerprint identification often demands an optical display characteristic in which the position for the fingerprint identification can be recognized when the screen is turned off, while the display of the display screen itself is not influenced when the screen is turned on. In consideration of the above demands, the present application contemplates to make use of color change characteristics of some materials, such that the materials can be in a transparent state when the screen emits a natural light, and can be displayed in a colored state when a particular light appears. In particular, a corresponding fingerprint identification area or other areas desired to be displayed can be displayed in the display area by an external particular light when the screen is turned off.

FIG. 1 shows a structure schematic diagram of one embodiment of a display unit provided in the present disclosure. The display unit 1 comprises a photochromic thin film 12 and an optical filter thin film 11 disposed on a side of the photochromic thin film 12. Optionally, the photochromic thin film 12 is prepared from a reversible photochromic material, and is used for presenting a colored state under an irradiation of a first preset light 2 and presenting a transparent state under an irradiation of a second preset light 4 based on the characteristics of the reversible photochromic material. The optical filter thin film 11 is a one-way optical filter thin film, which is substantially transparent to lights coming from a photochromic thin film side, but to external lights coming from the opposite side, it allows only the first preset light 2 to pass through and irradiate the photochromic thin film 12 and reflects lights of other wavelengths. A light emitting unit 3 for emitting the second preset light 4 is disposed on the other side of the photochromic thin film 12. That is, by making use of the color change characteristics of the reversible photochromic material, the material can present a certain color under the irradiation of the external first preset light 2, such that corresponding area can be seen by the user. This enables that an area to be used by the user can be directly seen in the display area in a screen turn-off state, without waking up the screen by pressing a button. When the light emitting unit 3 of the device itself emits the second preset light 4, the reversible photochromic material will present a transparent state under the irradiation of the second preset light 4. In this manner, when the device is in a bright screen or display state, the display unit will not adversely influence the display of the device itself, so as to improve the user's experience.

In some optional embodiments of the present disclosure, the optical filter thin film 11 is a cut-off optical filter for cutting off lights with wavelengths in a preset range from the exterior (e.g., lights coming from a side opposite to the photochromic thin film or lights coming from the front end of the display screen) and allowing lights in a wavelength range corresponding to the first preset light 2 to be transmitted through. In this manner, according to the difference between reversible photochromic materials, different cut-off optical filters can be selected to match with them, so as to be capable of controlling the wavelength range of light entering from the front end of the display screen, thereby reducing the influence of various external natural lights on the display unit.

In some optional embodiments of the present disclosure, the optical filter thin film has a multi-layer film structure, for example, a laminated structure of multiple film layers with different refractive indexes, to achieve a one-way optical filtering function. The material for forming the optical filter thin film may comprise at least one material selected from the group consisting of $Ti_2O_5$, $TiO_2$, $SiO_2$ and $MgF_2$. It should be noted that the optical filter thin film may also be prepared from other materials having the same function, and this is not limited in the present disclosure. The optical filter thin film may be formed by a process such as sputtering, deposition and the like, and this is not particularly limited in the present disclosure.

Figure 2:
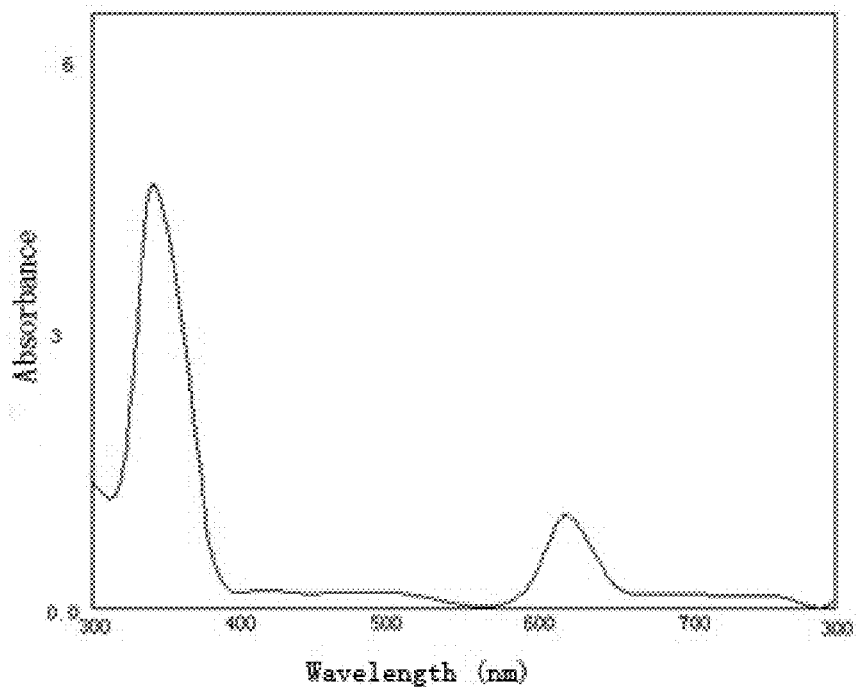
FIG. 2 is an example absorption spectrum of benzospirooxazine-N-propionic acid provided in the present disclosure.
Figure 3:
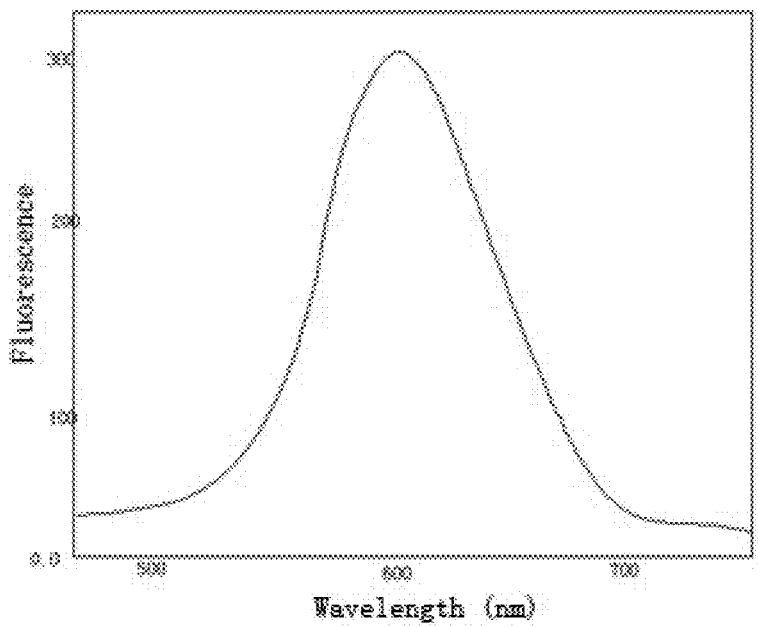
FIG. 3 is an example fluorescence emission spectrum of spirooxazine provided in the present disclosure.

In some optional embodiments of the present disclosure, the reversible photochromic material at least includes one of spirooxazines and spiropyrans or a mixture thereof, the first preset light is a ultraviolet light, and the second preset light is a visible light. FIG. 2 shows an absorption spectrum of benzospirooxazine-N-propionic acid provided in the present disclosure. As seen from the figure, on one hand, when an external natural light irradiates the display unit, only the ultraviolet light in the external natural light can be transmitted to the photochromic thin film due to the cut-off function of the optical filter thin film 11, and in this case, the spirooxazine will absorb the ultraviolet light and transform to an open ring state, and meanwhile emit a fluorescence spectrum as shown in FIG. 3. The fluorescence as shown in FIG. 3 is in the visible light range, so the user can obviously see a light emission in the display unit area (which may correspond to the fingerprint identification area). On the other hand, when the light emitting unit 3 emits the second preset light 4, e.g., when a natural light coming from interior irradiates the display unit, this natural light directly irradiates the photochromic thin film, and the spirooxazine will absorb the natural light in corresponding spectral range and transform to a closed ring state. At this time, the display unit presents a transparent state, and does not influence the display of the device.

It should be noted that the reversible photochromic material may be formed from spirooxazines or spiropyrans, or be prepared from other materials having the same function. The wavelength ranges of the first preset light and the second preset light corresponding to different materials are different, and are not limited in the present disclosure.

In some optional embodiments of the present disclosure, the reversible photochromic material further has a photoacid polymer material (photoacid generator) mixed therein. For example, the photoacid polymer can be polyvinylidene chloride-methyl acrylate (PVDC). In this manner, acid material, hydrogen chloride, released by PVDC under the irradiation of an ultraviolet light, can be used to stabilize the open ring state of doped spirooxazine or spiropyran, that is, the fluorescence emitted by the display area is made more stable and reliable.

Further, the reversible photochromic thin film prepared from spirooxazine or spiropyran doped with a photoacid polymer in the present disclosure can further be used to prepare a stable thin film useful for reversible optical information storage. For example, in the case of a photoacid polymer (such as PVDC) doped with 4-nitrospiropyran-N-propionic acid, protons are introduced after an ultraviolet light irradiation (through acid substance such as hydrogen chloride released by the photoacid polymer), which protect the oxygen anion on the spiropyran ring to prevent it from oxidation with the nitro group. In this manner, it achieves an effect of stabilizing the open ring system, and improves the photochemical reversibility of spiropyran in the solid state film, i.e., the fatigue resistance in the optical information storage application. Therefore, when applying in the optical information storage, the PVDC thin film of 4-nitrospiropyran-N-propionic acid is patterned, and the written fluorescence pattern information can be read out by a fluorescence confocal microscope, achieving the reversible optical information storage.

In some optional embodiments of the present disclosure, the reversible photochromic material further has a photoinitiator and/or a photocatalyst mixed therein. By adding a photoinitiator or a photocatalyst in the photochromic thin film, it allows the display unit to emit fluorescence after absorbing a small amount of ultraviolet light. That is, spirooxazine or spiropyran can be used as the starting material of the display unit, and can be mixed with an optically functional medium, e.g., a photoacid polymer such as polyvinylidene chloride-methyl acrylate (PVDC) respectively. The open ring state of doped spirooxazine or spiropyran can be stabilized by an acid substance, such as hydrogen chloride, released by PVDC under the irradiation of the ultraviolet light, and enables the display unit to emit fluorescence. On the other hand, under the irradiation of a visible light, spirooxazine or spiropyran will absorb a light with a certain wavelength in the visible light, and transform to a closed ring state, such that the display unit presents a transparent state.

Figure 4:
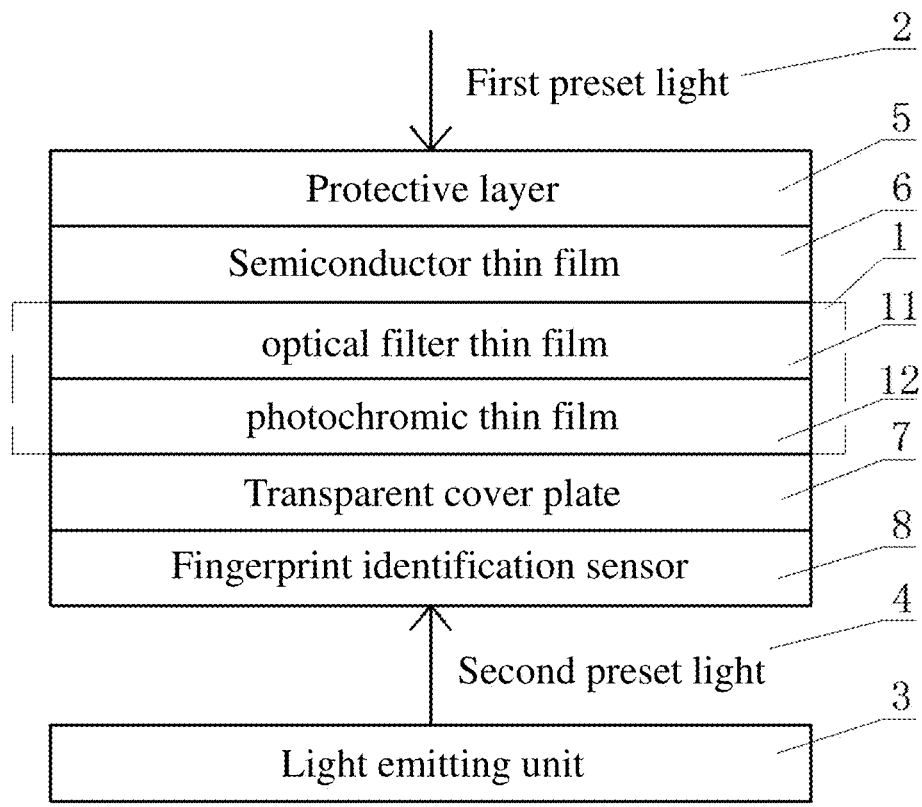
FIG. 4 is a structure schematic diagram of one embodiment of a display panel provided in the present disclosure.
Figure 5:
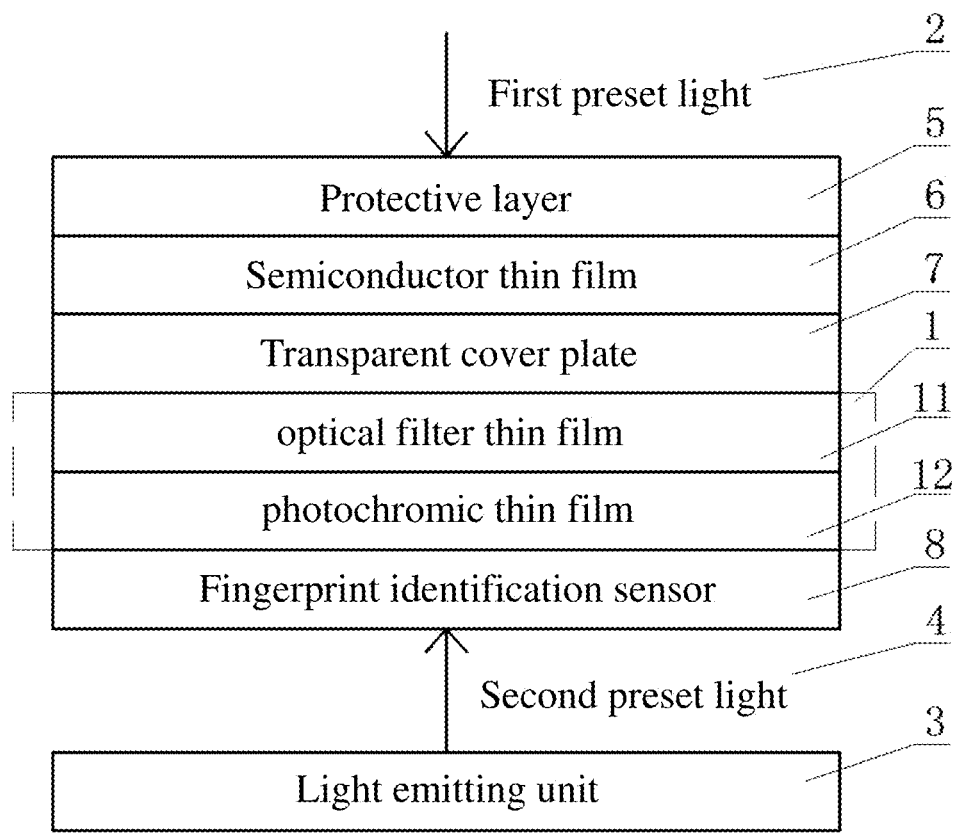
FIG. 5 is a structure schematic diagram of another embodiment of a display panel provided in the present disclosure.

FIGS. 4 and 5 show the structures of a display panel using the above display unit respectively. FIG. 4 is a structure schematic diagram of one embodiment of a display panel provided in the present disclosure. FIG. 5 is a structure schematic diagram of another embodiment of a display panel provided in the present disclosure. Particularly, the display panel comprises a transparent cover plate 7, a light emitting unit 3 and the display unit 1. The transparent cover plate 7 is disposed on a side of the display unit 1 close to the light emitting unit 3 and allows the photochromic thin film 12 to be close to the transparent cover plate 7 (as shown in FIG. 4). The second preset light 4 emitted by the light emitting unit 3 passes through the transparent cover plate 7 and enters into the photochromic thin film 12, and the first preset light 2 passes through the optical filter thin film 11 and enters into the photochromic thin film 12.

Alternatively, as shown in FIG. 5, the transparent cover plate 7 is disposed on a side of the display unit 1 away from the light emitting unit 3 and allows the optical filter thin film 11 to be close to the transparent cover plate 7. The second preset light 4 emitted by the light emitting unit 3 enters into the photochromic thin film 12, and the first preset light 2 passes through the transparent cover plate 7 and the optical filter thin film 11 sequentially and enters into the photochromic thin film 12. In this manner, the display unit is integrated into the display panel, such that the display panel can achieve a partial display in the display area in a screen turn-off state through the display unit, without influencing the normal light emission or display function of the display panel. The structures of the display panels as shown in the figures are simplified diagrams, and they actually further comprise various other cooperated layer structures, which will not be reiterated here.

It should be noted that when the display panel is a flexible display panel, the transparent cover plate is a flexible cover plate.

In some optional embodiments, the display unit can be used for displaying a fingerprint identification area, and in such embodiments, the display panel further comprises a fingerprint identification sensor 8, a semiconductor thin film 6 and a protective layer 5.

As shown in FIG. 4, when the transparent cover plate 7 is disposed on a side of the display unit 1 close to the light emitting unit 3, the semiconductor thin film 6 and the protective layer 5 are sequentially disposed on a side of the display unit 1 away from the light emitting unit 3, and the fingerprint identification sensor 8 is disposed between the transparent cover plate 7 and the light emitting unit 3. The display unit 1 coincides with a corresponding fingerprint identification area of the fingerprint identification sensor 8, so as to display the fingerprint identification area under the irradiation of the first preset light 2 and to become a transparent state under the irradiation of the second preset light 4. The semiconductor thin film 6 is configured to have a structure of stripes separated with each other, so as to cooperate with the fingerprint identification sensor 8 to achieve a fingerprint identification. The protective layer 5 is used for protecting the semiconductor thin film 6.

Optionally, the material of the semiconductor thin film 6 comprises a semiconductor polymer, an indium-tin oxide, a zinc-tin oxide, and the like. The semiconductor thin film 6 can be prepared by a vacuum deposition method, and further photoetched into stripes separated with each other by photoetching, which can, on one hand, avoid the overall conducting of the semiconductor thin film 6 during coupled charging, and on the other hand, partially charge a finger while the fingerprint identification sensor corresponding to the reset part of the finger identifies the fingerprint.

Optionally, the photochromic thin film may be prepared into a uniform and transparent thin film on the transparent cover plate by a process such as sputtering, applying, evaporation and the like. In this manner, the optical characteristics of the display device are not influenced when emitting a light, while the position of the fingerprint identification area can be quickly and accurately recognized.

As shown in FIG. 5, when the transparent cover plate 7 is disposed on a side of the display unit 1 away from the light emitting unit 3, the semiconductor thin film 6 and the protective layer 5 are sequentially disposed on a side of the transparent cover plate 7 away from the light emitting unit 3, and the fingerprint identification sensor 8 is disposed between the display unit 1 and the light emitting unit 3. The display unit 1 coincides with a corresponding fingerprint identification area of the fingerprint identification sensor 8, so as to display the fingerprint identification area under the irradiation of the first preset light 2 and to become a transparent state under the irradiation of the second preset light 4, and the semiconductor thin film 6 is configured to have a structure of stripes separated with each other, so as to cooperate with the fingerprint identification sensor 8 to achieve a fingerprint identification.

Figure 6:
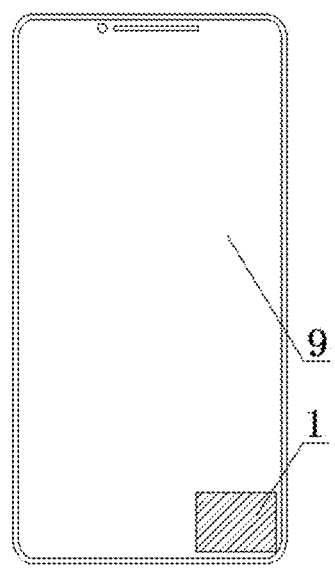
FIG. 6 is a top view of one embodiment of a display device provided in the present disclosure.

FIG. 6 shows a top view of one embodiment of a display device provided in the present disclosure. As illustrated in FIG. 6, one area in the display panel 9 can be selected to be the fingerprint identification area as needed, and the display unit 1 of the present disclosure is disposed in the fingerprint identification area, such that in a screen turn-off state, the display unit can present a colored state under the irradiation of the first preset light coming from exterior, and a fingerprint identification can be performed in this area. When the display panel is in a screen turn-on state, the display unit will present a transparent state, and the display function of the display panel will not be influenced.

Figure 7:
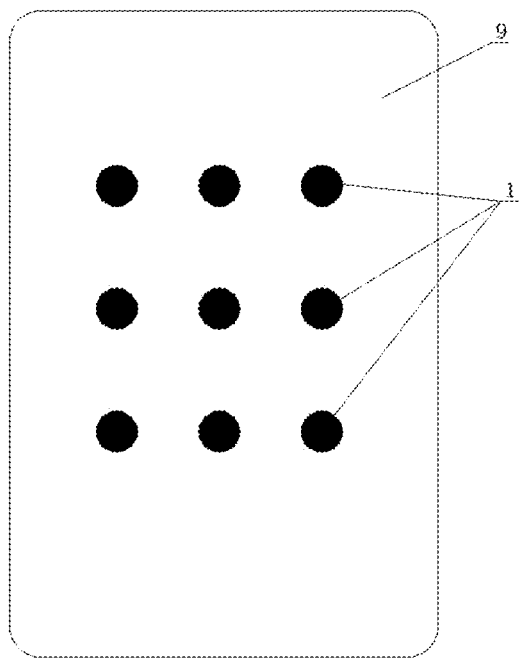
FIG. 7 is a top view of another embodiment of a display device provided in the present disclosure.

FIG. 7 shows a top view of another embodiment of a display device provided in the present disclosure. The display unit 1 is configured to be present in a plurality of groups, so as to cooperate with a preset control unit to achieve a corresponding control function. For example, a plurality of display units 1 are disposed in the display panel 9 in a nine-block-box arrangement, such that a user can slide the display units 1 in the nine-block-box following a certain sequence in a screen turn-off state, to directly achieve a control operation such as unlocking or starting the display panel or the like. The particular number of the display units, the shape of the arrangement, and the corresponding manner how to correspond to the control operation all can be designed and adjusted as needed, and they are not limited in the present disclosure.

Figure 8:
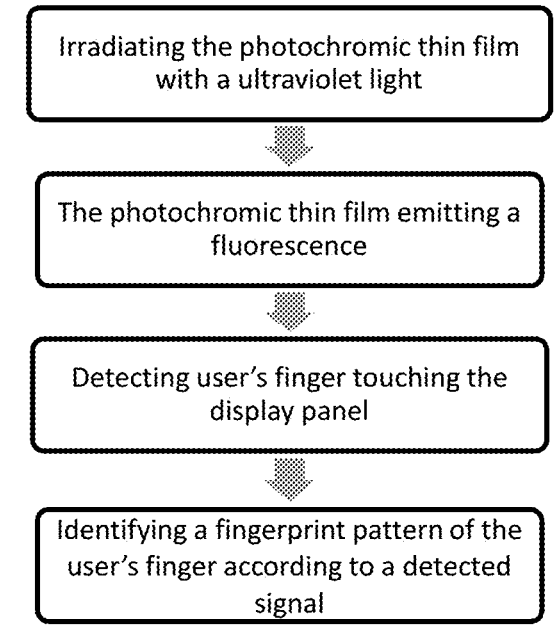
FIG. 8 is a schematic flow chart for achieving fingerprint identification with a display device provided in the present disclosure.

FIG. 8 shows a flow chart for achieving a fingerprint identification with a display device provided in the present disclosure. As illustrated in FIG. 8, after an external light irradiates the transparent cover plate, since the optical filter thin film below the transparent cover plate has a property of transmitting a ultraviolet light but reflecting a visible light for external lights, only the ultraviolet light irradiates the photochromic thin film. The photochromic thin film absorbs the ultraviolet light such that a light response ring opening of spirooxazine or spiropyran occurs, while polyvinylidene chloride-methyl acrylate releases hydrogen chloride to stabilize the open ring state of the doped spirooxazine or spiropyran, and thus the display unit presents a stable fluorescence after the ultraviolet light irradiation.

Optionally, the ultraviolet light has a wavelength in the range of 200 nanometers (nm) to 300 nm, for example, a wavelength of 254 nm. Generally, the photochromic thin film emits a fluorescence within 0.5 seconds (s) after the ultraviolet light irradiation, and the fluorescence emission is steady and stable within 5 s.

Then, according to the displayed area, the user can touch the display panel (such as OLED display panel) to perform a fingerprint identification, and the display device identifies a fingerprint pattern of the user's finger according to a detected signal so as to determine whether the identification is successful. If the identification is successful, the screen is lighted up, and then the light emitting unit (such as OLED) emits a visible light. The visible light irradiates the photochromic thin film such that the photochromic thin film returns to a transparent state.

As such, the display unit of the present disclosure can emit a fluorescence under the irradiation of an ultraviolet light, and return to a transparent state under the irradiation of a visible light emitted by the display device itself, enabling the fingerprint identification area to be quickly and effectively displayed in a screen turn-off state without influencing the display and light emission of the device itself. Therefore, the present disclosure solves the problem of failing to recognize the fingerprint identification position in a full screen display device without borders, so as to enhance the user's experience and be capable of improving the design appearance.

The present disclosure further provides a display device comprising the display panel as described above. Here, the display device includes various display devices such as mobile phones, tablet computers, touch computers, and the like.

As seen from the above description, in the display unit, the display panel and the display device provided in the present disclosure, a reversible photochromic material is used to prepare a photochromic thin film, and the photochromic thin film can present a colored state under an irradiation of a first preset light and present a transparent state under an irradiation of a second preset light based on the characteristics of the reversible photochromic material. In addition, an optical filter thin film is disposed on the photochromic thin film, to control a side of the photochromic thin film close to the optical filter thin film in such a manner that only the first preset light is allowed to pass through the optical filter thin film and enter into the photochromic thin film, while a light emitting unit for emitting the second preset light is disposed on a side of the photochromic thin film away from the optical filter thin film. In this manner, the display unit can be integrated into the display area, such that when the display area is irradiated by the second preset light emitted from the light emitting unit, the display unit is in a transparent state. That is, the display function of the display area will not be influenced, whereas when the first preset light from exterior passes through the optical filter thin film and enters into the photochromic thin film, the display unit presents a colored state, allowing a certain identification or control function to be achieved in a screen turn-off state accordingly, for example, the fingerprint identification in the display area. Therefore, in the display unit, the display panel and the display device of the present disclosure, a display unit capable of being integrated into a display area can be provided, which does not influence the normal display of the display area and can also display a certain area as needed to achieve corresponding identification or control function, thereby improving the user's experience.

The present disclosure further provides an optical information storage device comprising a reversible photochromic thin film as a storage medium for storing an optical information, wherein the reversible photochromic thin film presents a colored state under an irradiation of a first preset light, and presents a transparent state under an irradiation of a second preset light, a wavelength range of the first preset light being different from that of the second preset light.

In some optional embodiments of the present disclosure, the reversible photochromic thin film in the optical information storage device may have the same composition as that of the photochromic thin film in the above display unit, display panel and display device. However, for the convenience of writing and reading optical information, the reversible photochromic thin film in the optical information storage device is patterned.

It should be understood by those skilled in the art that the discussion on any above embodiment is only illustrative, but not intended to imply that the scope of the present disclosure (including claims) is limited thereto. Under the concept of the present disclosure, the technical features in the above embodiments or different embodiments can be combined, the steps can be performed in any sequence, and there are also many other changes of different aspects of the present disclosure as described above, which are not provided in detail for simplicity and clarity.

Further, in order to simplify the description and discussion and in order not to make the present invention difficult to understand, known power supply/ground connection with integrated circuit (IC) chips and other components may be shown or not shown in the drawings provided. In addition, devices may be shown in a block diagram form so as to avoid making the present invention difficult to understand. And this also takes into consideration the fact that the details of the embodiments regarding these block diagram devices greatly depend on the platform to implement the present invention (that is, these details should completely fall within the scope understood by those skilled in the art). In the case that some particular details (such as circuit) are illustrated to describe the exemplary embodiments of the present invention, it is apparent for those skilled in the art that the present invention can be implemented without these particular details or with these particular details changed. Therefore, these descriptions should be regarded as being illustrative but not limiting.

Although the present invention has been described with reference to particular embodiments of the present disclosure, many replacements, modifications and variations of these embodiments will become apparent to those skilled in the art from previous description. For example, other memory architectures (such as dynamic random access memory (DRAM)) can use the embodiments as discussed.

The embodiments of the present invention are intended to encompass all such replacements, modifications and variations falling within the broad range of the appended claims. Therefore, any omission, modification, equivalent replacement, improvement and the like made within the spirit and principle of the present application should be included within the protection scope of the present application.

What is claimed is:

1. A display panel, comprising:
   a transparent cover plate;
   a display unit comprising:
      a photochromic thin film that is configured to present a colored state under an irradiation of a first preset light, and to present a transparent state under an irradiation of a second preset light, a wavelength range of the first preset light being different from that of the second preset light; and
      an optical filter thin film on a side of the photochromic thin film, the optical filter thin film being a one-way optical filter thin film, which is substantially transparent to lights coming from a photochromic thin film side, but functioning as an optical filter to lights coming from the other side, only allowing the first preset light to be transmitted through and reflecting lights of other wavelengths; and
   a light emitting unit for emitting the second preset light, on the photochromic thin film side of the display unit,
   wherein the transparent cover plate is disposed on a side of the display unit close to the light emitting unit, and the photochromic thin film of the display unit is close to the transparent cover plate, such that the second preset light emitted by the light emitting unit is allowed to enter into the photochromic thin film via the transparent cover plate, and the first preset light is allowed to enter into the photochromic thin film via the optical filter thin film.

2. The display panel according to claim 1, wherein the display panel further comprises:
a fingerprint identification sensor;
a semiconductor thin film; and
a protective layer;
wherein the semiconductor thin film and the protective layer are sequentially disposed on a side of the display unit away from the light emitting unit, and the fingerprint identification sensor is disposed between the transparent cover plate and the light emitting unit,
wherein the display unit coincides with a corresponding fingerprint identification area of the fingerprint identification sensor, so as to display the fingerprint identification area under the irradiation of the first preset light and to become a transparent state under the irradiation of the second preset light, and the semiconductor thin film is configured to have a structure of stripes separated with each other, so as to cooperate with the fingerprint identification sensor to achieve a fingerprint identification.

3. A display device comprising the display panel according to claim 1.

4. The display panel according to claim 1, wherein the display unit is positioned in a display area of the display panel.

5. The display panel according to claim 1, wherein the display panel is a flexible display panel, and the cover plate is a flexible cover plate.

6. The display panel according to claim 5, wherein the display panel is full screen without borders.

7. The display panel according to claim 1, wherein the display unit is configured to be present in a plurality of groups, so as to cooperate with a preset control unit to achieve a corresponding control function.

8. The display panel according to claim 1, wherein the photochromic thin film comprises a reversible photochromic material.

9. The display panel according to claim 8, wherein the reversible photochromic material at least includes one of spirooxazines or spiropyrans or a mixture thereof, and wherein the first preset light is an ultraviolet light, and the second preset light is a visible light.

10. The display panel according to claim 1, wherein the optical filter thin film has a laminated structure of multiple film layers with different refractive indexes.

11. A display panel, comprising:
a transparent cover plate;
a display unit comprising:
  a photochromic thin film that is configured to present a colored state under an irradiation of a first preset light, and to present a transparent state under an irradiation of a second preset light, a wavelength range of the first preset light being different from that of the second preset light; and
  an optical filter thin film on a side of the photochromic thin film, the optical filter thin film being a one-way optical filter thin film, which is substantially transparent to lights coming from a photochromic thin film side, but functioning as an optical filter to lights coming from the other side, only allowing the first preset light to be transmitted through and reflecting lights of other wavelengths; and
a light emitting unit for emitting the second preset light, on the photochromic thin film side of the display unit,
wherein the transparent cover plate is disposed on a side of the display unit away from the light emitting unit and the optical filter thin film of the display unit is close to the transparent cover plate, such that the second preset light emitted by the light emitting unit is allowed to enter into the photochromic thin film, and the first preset light is allowed to pass through the transparent cover plate and the optical filter thin film sequentially and enter into the photochromic thin film.

12. The display panel according to claim 11,
wherein a semiconductor thin film and a protective layer are sequentially disposed on a side of the transparent cover plate away from the light emitting unit, and a fingerprint identification sensor is disposed between the display unit and the light emitting unit; and
wherein the display unit coincides with a corresponding fingerprint identification area of the fingerprint identification sensor, so as to display the fingerprint identification area under the irradiation of the first preset light and to become a transparent state under the irradiation of the second preset light, and the semiconductor thin film is configured to have a structure of stripes separated with each other, so as to cooperate with the fingerprint identification sensor to achieve a fingerprint identification.

13. The display panel according to claim 11, wherein the display unit is configured to be present in a plurality of groups, so as to cooperate with a preset control unit to achieve a corresponding control function.

14. A display device comprising the display device according to claim 11.

15. The display panel according to claim 11, wherein the display unit is positioned in a display area of the display panel.

16. The display panel according to claim 11, wherein the display panel is a flexible display panel, and the cover plate is a flexible cover plate.

17. The display panel according to claim 11, wherein the display panel is full screen without borders.

18. The display panel according to claim 11, wherein, the optical filter thin film has a laminated structure of multiple film layers with different refractive indexes.

19. The display panel according to claim 11, wherein the photochromic thin film comprises a reversible photochromic material.

20. The display panel according to claim 19, wherein the reversible photochromic material at least includes one of spirooxazines or spiropyrans or a mixture thereof, and wherein the first preset light is an ultraviolet light, and the second preset light is a visible light.

* * * * *